(12) United States Patent
Callegari et al.

(10) Patent No.: US 6,395,650 B1
(45) Date of Patent: May 28, 2002

(54) METHODS FOR FORMING METAL OXIDE LAYERS WITH ENHANCED PURITY

(75) Inventors: Alessandro Cesare Callegari, Yorktown Heights; Fuad Elias Doany, Katonah; Evgeni Petrovich Gousev, Mahopac; Theodore Harold Zabel, Yorktown Heights, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/694,173

(22) Filed: Oct. 23, 2000

(51) Int. Cl.[7] ............... H01L 21/31; H01L 21/469; H01L 21/26
(52) U.S. Cl. ............... 438/785; 438/771; 438/795
(58) Field of Search .................. 438/771, 785, 438/795, 906; 134/1, 1.3

(56) References Cited

U.S. PATENT DOCUMENTS

| | | | |
|---|---|---|---|
| 4,505,949 A | | 3/1985 | Jelks et al. |
| 5,669,979 A | * | 9/1997 | Eliott et al. ............ 134/1 |
| 5,709,754 A | | 1/1998 | Morinville et al. |
| 5,814,156 A | * | 9/1998 | Eliott et al. ............ 134/1 |
| 5,980,983 A | | 11/1999 | Gordon |
| 6,117,706 A | * | 9/2000 | Yoshioka et al. ........ 438/106 |

OTHER PUBLICATIONS

Callegari, et al., "DUV stability of carbon films for attenuated phase shift mask applications," SPIE 23rd Annual Interational Symposium on Microlithography, Santa Clara, CA, Feb. 22–27, 1998.

* cited by examiner

Primary Examiner—Alexander G. Ghyka
(74) Attorney, Agent, or Firm—Robert M. Trepp; Alek P. Szecsy

(57) ABSTRACT

Within: (1) a method for purifying a metal oxide layer; and (2) a method for forming with enhanced purity a metal oxide layer, there is employed an irradiation of either: (1) a metal oxide layer; or (2) a substrate in the presence of at least one of an oxidant and a metal source material, such as to either: (1) reduce a concentration of a contaminant material within a metal oxide base material from which is formed a metal oxide layer; or (2) inhibit in a first instance formation of a contaminant material within a metal oxide layer. The metal oxide layer having incorporated therein the reduced concentration of contaminant material is particularly useful as a capacitive dielectric layer within a capacitive device within a microelectronic fabrication.

16 Claims, 2 Drawing Sheets

METHODS FOR FORMING METAL OXIDE LAYERS WITH ENHANCED PURITY

BACKGROUND OF THE INVENTION

1. Field of the Invention

The present invention relates generally to methods for forming metal oxide layers within fabrications including but not limited to as microelectronic fabrications. More particularly, the present invention relates to methods for forming, with enhanced compositional purity, metal oxide layers within fabrications including but not limited to microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased, and more particularly as semiconductor integrated circuit microelectronic fabrication integration levels have increased, there has evolved a continuing and correlating trend towards decreased linewidth dimensions and decreased thickness dimensions of microelectronic layers that are employed when fabricating microelectronic devices and microelectronic structures employed in fabricating microelectronic fabrications.

Of the microelectronic layers whose thicknesses have traditionally decreased when fabricating advanced microelectronic fabrications, and whose thickness uniformity and materials composition integrity is generally of considerable importance when fabricating microelectronic fabrications, are capacitive dielectric layer which are conventionally employed as: (1) gate dielectric layers within field effect transistors (FETs) within semiconductor integrated circuit microelectronic fabrications; as well as (2) capacitor plate separation dielectric layers within various types of capacitors within various types of microelectronic fabrications, including but not limited to semiconductor integrated circuit microelectronic fabrications.

While continuing decreases in thickness of capacitive dielectric layers are generally desirable in the art of microelectronic fabrication in order to theoretically provide enhanced performance of capacitive devices within advanced microelectronic fabrications, there nonetheless exist considerable technical barriers to forming, with both decreased thickness and enhanced compositional Integrity, capacitive dielectric layers of conventional dielectric materials, such as silicon oxide dielectric materials, silicon nitride dielectric materials, silicon oxynitride dielectric materials and composites thereof, such as to provide enhanced performance of capacitive devices within advanced microelectronic fabrications, and in particular enhanced performance of capacitive devices within advanced semiconductor integrated circuit microelectronic fabrications.

In an effort to provide enhanced performance of capacitive devices within advanced microelectronic fabrications while avoiding decreased thicknesses of capacitive dielectric layers within the capacitive devices, there has been proposed in the alternative of employing conventional silicon oxide dielectric materials, silicon nitride dielectric materials, silicon oxynitride dielectric materials and composites thereof when forming capacitive dielectric layers within advanced microelectronic fabrication, to employ dielectric materials having generally higher dielectric constants, typically and preferably in a range of from about 10 to about 30 (in comparison with a range of from about 4 to about 8 for conventional silicon oxide dielectric materials, silicon nitride dielectric materials, silicon oxynitride dielectric materials and composites thereof). Such dielectric materials having generally higher dielectric constants allow for increased thicknesses of capacitive dielectric layers while simultaneously providing for enhanced capacitive properties of capacitive devices when fabricating microelectronic fabrications. Of the higher dielectric constant dielectric materials that have been proposed for use when forming capacitive dielectric layers within capacitive devices within advanced microelectronic fabrications, alternative primary and higher order metal oxide dielectric materials, including metal-silicon oxide dielectric materials (i.e., metal silicate dielectric materials), as well as derivatives thereof, are presently of considerable interest.

While alternative primary and higher order metal oxide dielectric materials, including metal-silicon oxide dielectric materials, are thus desirable in the art of microelectronic fabrication for use when forming capacitive dielectric layers within capacitive devices within microelectronic fabrications, alternative primary and higher order metal oxide dielectric materials, including metal-silicon oxide dielectric materials, are similarly nonetheless also not entirely without problems in the art of microelectronic fabrication when forming capacitive dielectric layers within capacitive devices within microelectronic fabrications. In that regard, it is often difficult to form alternative primary and higher order metal oxide dielectric materials, including metal-silicon oxide dielectric materials, with enhanced compositional purity when forming a capacitive dielectric layer within a capacitive device within a microelectronic fabrication, particularly when employing for forming the alternative primary and higher order metal oxide dielectric materials, including metal-silicon oxide dielectric materials, chemical vapor deposition (CVD) methods, and in particular chemical vapor deposition (CVD) methods that employ metal and carbon containing source materials, such as but not limited to organometallic (i.e., metal-carbon bonded) metal and carbon containing source materials.

It is thus desirable in the art of microelectronic fabrication to provide methods and materials for forming, with enhanced compositional purity, alternative primary and higher order metal oxide dielectric materials, including metal-silicon oxide dielectric materials, and derivatives thereof, for use when forming capacitive dielectric layers within capacitive devices within microelectronic fabrications.

It is towards the foregoing object that the present invention is more specifically directed.

Various methods and materials have been disclosed within arts including but not limited to microelectronic fabrication arts, for forming substrates and layers, such as but not limited to microelectronic fabrication substrates and microelectronic fabrication layers, with desirable properties within arts including but not limited to microelectronic fabrication arts.

For example, Jelks, in U.S. Pat. No. 4,505,949, discloses a method for forming within a microelectronic fabrication a microelectronic layer upon a microelectronic substrate while avoiding when forming the microelectronic layer upon the microelectronic substrate use of an extrinsic toxic gaseous microelectronic layer source material. To realize the foregoing object, the method comprises a two step method wherein: (1) a first step within the two step method employs an in-situ upstream plasma etching of a solid microelectronic layer source material target to form an intrinsic gaseous microelectronic layer source material; and (2) a second step within the two step method employs an in-situ downstream decomposition, preferably an in-situ downstream laser initiated decomposition, of the intrinsic gaseous microelectronic layer source material, to form the microelectronic layer upon the microelectronic substrate.

In addition, Callegari et al., in "DUV stability of carbon films for attenuated phase shift mask applications," SPIE 23$^{rd}$ Annual International Symposium on Microlithography, Santa Clara, Calif., Feb. 22–27, 1998, discloses a method for fabricating within an attenuated phase shift mask fabrication an amorphous carbon layer for use as a semitransparent shifter layer within the attenuated phase shift mask fabrication, such that the attenuated phase shift mask fabrication is stable upon deep ultraviolet irradiation within an oxygen containing ambient environment (i.e., under conventional photoexposure conditions to which the attenuated phase shift mask fabrication is exposed). To realize the foregoing object, the method employs a reactive sputtering method that in turn employs: (1) a graphite sputtering target; (2) an argon/hydrocarbon reactant gas composition; and (3) a phase shift mask substrate held at a radio frequency bias potential, when forming the amorphous carbon layer within the attenuated phase shift mask fabrication.

Further, Elliott et al., in U.S. Pat. No. 5,669,979 and U.S. Pat. No. 5,814,156, disclose: (1) a method for removing from a substrate employed within a fabrication including but not limited to a microelectronic fabrication; and (2) an apparatus for removing from the substrate employed within the fabrication including but not limited to the microelectronic fabrication, a contaminant layer, such as but not limited to a ion implanted photoresist mask layer contaminant layer. To realize the foregoing object, the method and the apparatus employ a simultaneous ultraviolet laser irradiation of the contaminant layer in the presence of a reactive gas while employing conditions which photo-facilitate a chemical reaction which removes from the substrate the contaminant layer.

Yet further, Morinville et al., in U.S. Pat. No. 5,709,754, discloses an analogous method and an analogous apparatus for removing from a substrate, and in particular a microelectronic fabrication substrate, a photoresist layer employed in fabricating the substrate. To realize the foregoing object, the analogous apparatus is employed within the context of an analogous two-step photoresist layer stripping method, wherein the analogous two-step photoresist layer stripping method employs; (1) a first ultraviolet laser irradiation of the photoresist layer in the presence of a first oxidizing gas composition comprising oxygen to remove from the substrate a bulk portion of the photoresist layer and leave upon the substrate a remainder portion of the photoresist layer; followed by (2) a second ultraviolet laser irradiation of the remainder portion of the photoresist layer in the presence of a second oxidizing gas composition comprising oxygen and ozone to remove the remainder portion of the photoresist layer from the substrate.

Finally, Gordon, in U.S. Pat. No. 5,980,983, discloses a chemical vapor deposition (CVD) method for forming, within fabrications including but not limited to microelectronic fabrications, metal oxide layers while in general avoiding problems associated with conventional solid chemical vapor deposition (CVD) metal source materials when forming the metal oxide layers. To realize the foregoing object, the method employs an admixture of metal beta-diketonate chemical vapor deposition (CVD) metal source materials, which in general are formed as liquid chemical vapor deposition (CVD) metal source materials.

Desirable in the art of microelectronic fabrication are additional methods and materials for forming, with enhanced compositional purity, primary and higher order metal oxide dielectric materials, including metal-silicon oxide dielectric materials, and derivatives thereof, for use within layers within microelectronic fabrications.

It is towards the foregoing object that the present invention is more generally directed.

SUMMARY OF THE INVENTION

A first object of the present invention is to provide a method for forming a metal oxide layer within a microelectronic fabrication.

A second object of the present invention is to provide a method in accord with the first object of the present invention, wherein the metal oxide layer is formed with enhanced compositional purity.

A third object of the present invention is to provide a method in accord with the first object of the present invention and the second object of the present invention, wherein the method is readily commercially implemented.

In accord with the objects of the present invention, there is provided by the present invention: (1) a method for purifying a metal oxide layer that may be employed within a microelectronic fabrication; and (2) a method for fabricating with enhanced purity a metal oxide layer that may be employed within a microelectronic fabrication.

Within the method for purifying the metal oxide layer, there is first provided a substrate having formed thereover a metal oxide layer, where the metal oxide layer is formed of a metal oxide base material having incorporated therein a concentration of a contaminant material susceptible to reaction with an oxidant to form a volatile contaminant material. There is then positioned the substrate within a reactor chamber and introduced into the reactor chamber the oxidant. There is then irradiated within the reactor chamber the metal oxide layer and the reactant with a radiation source such as to reduce within the metal oxide base material the concentration of the contaminant material and thus form from the metal oxide layer a purified metal oxide layer.

Within the method for forming with enhanced purity the metal oxide layer, there is first provided a reactor chamber. There is then positioned within the reactor chamber a substrate. There is then formed over the substrate within the reactor chamber, while irradiating the substrate within the reactor chamber in the presence of at least one of an oxidant and a metal source material within the reactor chamber with a radiation source, a metal oxide layer, wherein the metal source material has incorporated therein a contaminant material susceptible to reaction with the oxidant to form a volatile contaminant material.

Thus, within the present invention with respect to both: (1) purifying a metal oxide layer; and (2) forming with enhanced purity a metal oxide layer, there is employed an irradiation of either: (1) a metal oxide layer; or (2) a substrate within the presence of at least one of an oxidant and a metal source material, such as to either: (1) reduce a concentration of a contaminant material incorporated within a metal oxide base material from which is formed a metal oxide layer; or (2) inhibit in a first instance formation of a contaminant material within a metal oxide layer.

The methods of the present invention are readily commercially implemented. The present invention employs methods and materials as are otherwise generally known in the art of microelectronic fabrication, but employed within the context of specific process limitations to provide the present invention. Since it is thus a specific set of process limitations that provides at least in part the present invention, rather than the existence of methods and materials that provides the present invention, the methods of the present invention are readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides: (1) a method for purifying a metal oxide layer that may be employed within a microelectronic fabrication; and (2) a method for fabricating with enhanced purity a metal oxide layer that may be employed within a microelectronic fabrication.

Within the method for purifying the metal oxide layer, there is first provided a substrate having formed thereover a metal oxide layer, where the metal oxide layer is formed of a metal oxide base material having incorporated therein a concentration of a contaminant material susceptible to reaction with an oxidant to form a volatile contaminant material. There is then positioned the substrate within a reactor chamber and introduced into the reactor chamber the oxidant. There is then irradiated within the reactor chamber the metal oxide layer and the oxidant with a radiation source such as to reduce within the metal oxide base material the concentration of the contaminant material and thus form from the metal oxide layer a purified metal oxide layer.

Within the method for forming with enhanced purity the metal oxide layer, there is first provided a reactor chamber. There is then positioned within the reactor chamber a substrate. There is then formed over the substrate within the reactor chamber, while irradiating the substrate within the reactor chamber within the presence of at least one of an oxidant and a metal source material within the reactor chamber with a radiation source, a metal oxide layer, wherein the metal source material has incorporated therein a contaminant material susceptible to reaction with the oxidant to form a volatile contaminant material.

Thus, within the present invention with respect to both: (1) purifying a metal oxide layer; and (2) forming with enhanced purity a metal oxide layer, there is employed an irradiation of either: (1) a metal oxide layer; or (2) a substrate in the presence of at least one of an oxidant and a metal source material, such as to either; (1) reduce a concentration of a contaminant material within a metal oxide base material from which is formed a metal oxide layer; or (2) inhibit in a first instance formation of a contaminant material within a metal oxide layer.

The methods of the present invention may be employed for forming with enhanced compositional purity metal oxide layers, that may be employed as layers including but not limited to capacitive dielectric layers, within fabrications including but not limited to microelectronic fabrications (such as but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications), optical fabrications and decorative fabrications.

First Preferred Embodiment

Figure 1:
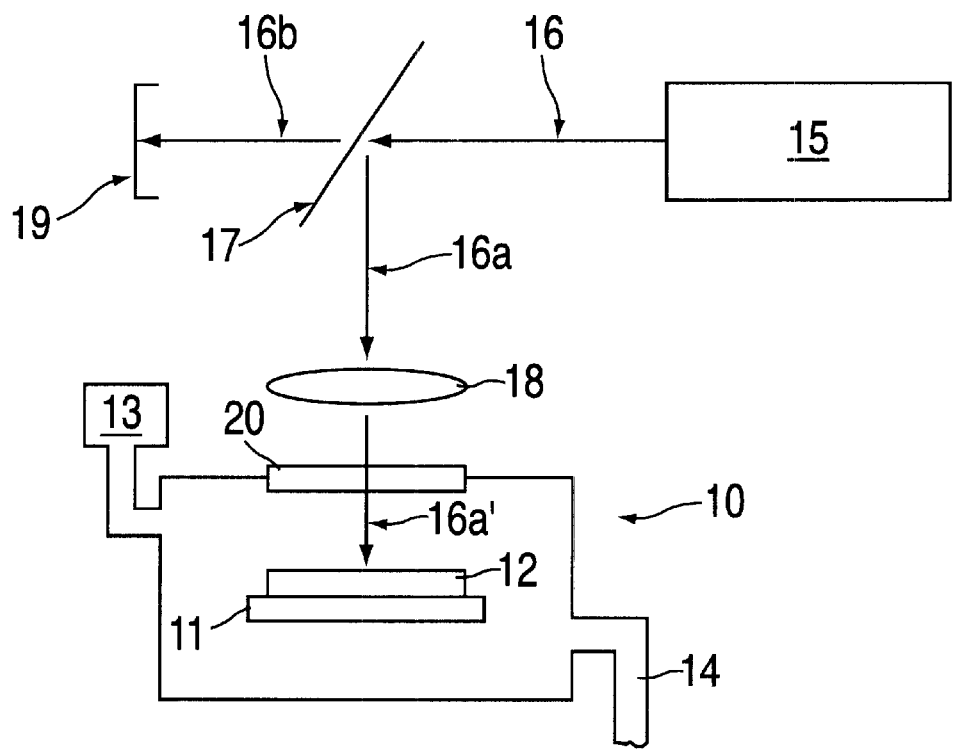
FIG. 1 shows a schematic diagram of an apparatus that may be employed in conjunction with a first preferred embodiment of the present invention.

Referring now to FIG. 1, there is shown a schematic diagram of an apparatus that may be employed for purifying a metal oxide layer in accord with a first preferred embodiment of the present invention.

Shown in FIG. 1, in a first instance, is generally a reactor chamber 10, having positioned therein a platen 11, in turn having positioned thereupon a substrate 12. Similarly, there is also shown within the schematic diagram of FIG. 1 an oxidant source 13 employed for supplying an oxidant to the reactor chamber 10 and an exhaust port 14 employed for exhausting a spent oxidant from the reactor chamber 10.

There is also shown with respect to the apparatus whose schematic diagram is illustrated in FIG. 1 a radiation source 15 from which issues a primary radiation beam 16. In turn, the primary radiation beam 16 is consequent to incidence upon a partially transmissive mirror 17 split into: (1) a transmitted radiation beam 16b which is eventually captured by a beam stop 19; and (2) a reflected radiation beam 16a which in turn passes through a focusing lens 18 to form a focused reflected radiation beam 16a' which in turn passes through a window 20 within the reactor chamber 10 and ultimately impinges upon the substrate 12. Within the first preferred embodiment of the present invention, the partially transmissive mirror 17 is typically and preferably employed to attenuate the primary radiation beam 16 which issues from the radiation source 15 when irradiating within the substrate 12 a comparatively small substrate area, such as to avoid radiation induced damage to the substrate 12.

Within the first preferred embodiment of the present invention, various of the components of the apparatus as illustrated within the schematic cross-sectional diagram of FIG. 1 are conventional in the art of microelectronic fabrication apparatus fabrication and may correspond generally with the apparatus as disclosed within Elliott et al., as cited within the Description of the Related Art, all of which related art is incorporated herein fully by reference.

Within the present invention, the substrate 12 (or more generally an upper portion thereof) comprises a layer formed of a metal oxide base material having incorporated therein a concentration of a contaminant material susceptible to reaction with the oxidant supplied into the reactor chamber 10 by the oxidant source 13 to form a volatile contaminant material. Thus, within the present invention, the nature of the oxidant supplied into the reactor chamber 10 by the oxidant source 13 is selected within the context of the contaminant material which is incorporated into the metal oxide base material which comprises the metal oxide layer which in turn comprises the substrate 12.

Within the first preferred embodiment of the present invention with respect to the metal oxide base material having incorporated therein the contaminant material, the metal oxide base material is typically and preferably formed of a primary metal oxide material (wherein the primary metal oxide material may consist of a silicon oxide material), a higher order metal oxide material (which may include a metal-silicon oxide material that includes in addition to silicon metal at least one metal other than silicon metal) or a derivative thereof (such as a nitride derivative thereof), preferably of generally higher dielectric constant, when employed within the context of applications as cited within the Description of the Related Art. Thus, examples of specific metal oxide dielectric materials, including metal-silicon oxide dielectric materials, which may be purified within the context of the first preferred embodiment of the present invention include, but are not limited to, silicon oxides aluminum oxides, zirconium oxides, hafnium oxides, tantalum oxides, yttrium oxides, titanium oxides, lanthanum oxides, gadolinium oxides, lanthanum-aluminum oxides, zirconium-aluminum oxides, yttrium-aluminum oxides, hafnium-aluminum oxides, titanium-aluminum oxides, barium-strontium-titanium oxides, lead-zirconium-titanium oxides, zirconium-silicon oxides (i.e., zirconium silicates), hafnium-silicon oxides (i.e., hafnium silicates), zirconium oxynitrides, yttrium oxynitrides, hafnium oxynitrides, tantalum oxynitrides, titanium oxynitrides, aluminum oxynitrides, zirconium-silicon oxynitrides, yttrium-silicon oxynitrides, hafnium-silicon oxynitrides, tantalum-silicon oxynitrides, titanium-silicon oxynitrides and aluminum-silicon oxynitrides.

Similarly, within the first preferred embodiment of the present invention with respect to the contaminant material incorporated into the metal oxide base material, the contaminant material is generally a reduced contaminant material, more particularly a carbon reduced contaminant material, a sulfur reduced contaminant material or a hydrogen reduced contaminant material, but most particularly a carbon reduced contaminant material, a concentration of which is desired to be decreased within the metal oxide base material. Within the preferred embodiment of the present invention, the carbon reduced contaminant material within the metal oxide base material typically and preferably derives from incomplete oxidation of a metal and carbon containing source material typically and preferably employed for forming the metal oxide base material from which is formed the metal oxide layer while employing a deposition method such as but not limited to a thermal chemical vapor deposition (CVD) method, a plasma enhanced chemical vapor deposition (PECVD) method or a variant chemical vapor deposition (CVD) method thereupon (such as but not limited to an atomic layer deposition (ALD) method wherein discrete atomic layers are deposited upon a substrate and independently subsequently reacted (typically oxidized) upon the substrate, analogous molecular layer deposition methods wherein discrete molecular layers are deposited upon and independently subsequently reacted upon a substrate, and related digital chemical vapor deposition (CVD) methods generally), although other methods may also be employed for forming the metal oxide layer.

In order to provide within the context of the present invention for decrease of the concentration of the contaminant material within the metal oxide base material within the metal oxide layer from which is comprised the substrate 12: (1) the substrate 12 which comprises the metal oxide layer formed of the metal oxide base material having incorporated therein the contaminant material susceptible to reaction with the oxidant to form the volatile contaminant material; and (2) the oxidant, are irradiated with the focused reflected radiation beam 16a' within the reactor chamber 10 such as to reduce within the metal oxide base material the concentration of the contaminant material and thus form from the metal oxide layer a purified metal oxide layer.

Within the preferred embodiment of the present invention with respect to the oxidant source 13 which provides the oxidant, the oxidant source 13 typically provides an oxidant selected from the group consisting of oxygen containing oxidants (such as but not limited to oxygen, ozone, nitrous oxide, nitric oxide and moisture oxidants) and plausibly also halogen oxidants (such as but not limited to fluorine and chlorine oxidants), but more preferably oxygen containing oxidants. Similarly, within the preferred embodiment of the present invention with respect to the radiation source 15 which provides the focused reflected radiation beam 16a', the radiation source 15 is typically and preferably an ultraviolet radiation source (having at least one wavelength of less than about 250 nanometers and more preferably from about 157 to about 248 nanometers) selected from the group consisting of ultraviolet laser radiation sources, ultraviolet lamp radiation sources (such as ozone ultraviolet lamp radiation sources) and ultraviolet plasma discharge radiation sources.

Typically and preferably, for a metal oxide layer formed of a metal oxide base material having a thickness of from about 5 to about 10000 angstroms, the focused reflected radiation beam 16a' may be either: (1) employed within the context of a flood exposure when irradiating the substrate 12; or (2) scanned either unidirectionally or multidirectionally across the substrate 12 when irradiating the substrate 12, while the substrate 12 is held at a temperature of from about 15 to about 500 degrees centigrade within the presence of the oxidant at a pressure of from about 0.001 to about 760 torr and a flow rate of from about 10 to about 1000 standard cubic centimeters per minute (sccm) to provide a dose of the radiation from the radiation source 15 of from about 1 to about 5000 joules per square centimeter (more preferably from about 500 to about 5000 joules per square centimeter) of substrate 12 surface area. When the radiation source 15 comprises a pulsed ultraviolet laser radiation source for irradiating the substrate 12, the focused reflected radiation beam 16a' typically and preferably has a radiation intensity of from about 0.1 to about 20 millijoules per square centimeter of beam shape per pulse. Under such circumstances, the focused reflected radiation beam 16a' is typically and preferably pulsed at a frequency of from about 10 to about 200 hertz, more preferably from about 50 to about 150 hertz. Thus, the focused reflected radiation beam 16a' typically employs a radiation intensity of from about 10 to about 200 millijoules per square centimeter (more preferably from about 50 to about 100 millijoules per square centimeter) of beam shape per second.

As is understood by a person skilled in the art, under circumstances where the substrate is irradiated in the presence of an atmospheric oxygen oxidant at atmospheric pressure, a reactor chamber, such as the reactor chamber 10, is not per se required within the context of the present invention, but under such circumstances any enclosure, room or area (whether or not enclosed) within which irradiation of a substrate having formed thereupon a metal oxide layer is undertaken is understood within the context of the present invention to be a "reactor chamber."

Similarly, as is further understood by a person skilled in the art, selection of various radiation wavelengths from the radiation source 15, and particularly lower ultraviolet radiation wavelengths from the radiation source 15, may under certain circumstances facilitate in-situ formation of more active oxidant species from oxidant materials which are supplied into the reactor chamber 10 from the oxidant source 13. For example and without limitation, electronically active oxygen species and ozone species may under certain circumstances be formed incident to lower wavelength ultraviolet irradiation of the oxygen oxidant materials as noted above.

Thus, in accord with the first preferred embodiment of the present invention, and in conjunction with use of the apparatus whose schematic cross-sectional diagram is illustrated in FIG. 1, there may be purified a metal oxide layer formed over a substrate employed within a microelectronic fabrication. The first preferred embodiment of the present invention realizes the foregoing object by simultaneously irradiating the metal oxide layer in the presence of an oxidant such that there is reduced within a metal oxide base material from which is formed the metal oxide layer a concentration of a contaminant material and thus formed from the metal oxide layer a purified metal oxide layer.

As is understood by a person skilled in the art, the first preferred embodiment of the present invention is readily contrasted with the related art, as cited within the Description of the Related Art, and in particular as disclosed within Elliott et al. and Morinville et al. as cited within the Description of the Related art, insofar as the present invention provides for reduction of a contaminant material from within a metal oxide base material where the contaminant material is typically and preferably at least nominally uniformly distributed within the metal oxide base material, while the related art is directed towards removal of a contaminant material layer from a base material layer, where the contaminant material layer is not uniformly distributed within the base material layer.

Second Preferred Embodiment

Figure 2:
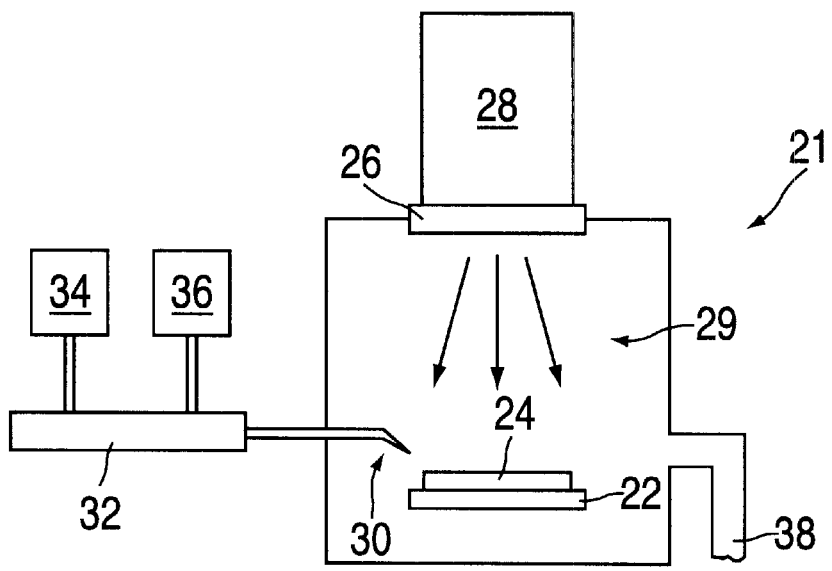
FIG. 2 shows a schematic diagram of an apparatus that may be employed in conjunction with a second preferred embodiment of the present invention.

Referring now to FIG. 2, there is shown a schematic diagram illustrating an apparatus that may be employed for forming, with enhanced purity, a metal oxide layer upon a substrate in accord with a second preferred embodiment of the present invention.

As is understood by a person skilled in the art, and as will be illustrated in greater detail within the context of the description which follows, the second preferred embodiment of the present invention differs from the first preferred embodiment of the present invention insofar as while the first preferred embodiment of the present invention is directed towards a method for purifying a metal oxide layer formed over a substrate after the metal oxide layer has been formed over the substrate, the second preferred embodiment of the present invention is instead directed towards forming with enhanced purity, in a first instance, a metal oxide layer over a substrate.

As is illustrated within the schematic cross-sectional diagram of FIG. 2, there is shown in general a reactor chamber 21 having positioned therein a platen 22 in turn having positioned thereupon a substrate 24.

Within the second preferred embodiment of the present invention, the reactor chamber 21 is generally analogous to the reactor chamber 10 as generally illustrated within the schematic diagram of FIG. 1, and the platen 22 is otherwise analogous or equivalent with the platen 11 as illustrated within the schematic cross-sectional diagram of FIG. 1. However, within the second preferred embodiment of the present invention the reactor chamber 21 is typically and preferably intended to be employed within the context of vacuum deposition processes while the reactor chamber 10 as illustrated within the schematic cross-sectional diagram of FIG. 1 may more generally be employed at or near atmospheric pressure.

Similarly, and as noted above, while within the first preferred embodiment of the present invention the substrate 12 already has formed thereupon a layer formed from a metal oxide base material having incorporated therein a concentration of a contaminant material susceptible to oxidation with an oxidant to form a volatile contaminant material, the substrate 24 within the second preferred embodiment of the present invention is typically and preferably provided absent formed thereupon a layer formed of a metal oxide base material having incorporated therein the concentration of the contaminant material susceptible to oxidation to form the volatile contaminant material.

Shown also within the schematic diagram of FIG. 2 is a manifold 32 which supplies into the reactor chamber 21 through a nozzle 30 positioned in the vicinity of the substrate 24 at least one of a metal source material from a metal source 34 and an oxidant from an oxidant source 36 when forming upon the substrate 24 a metal oxide layer with enhanced purity. Similarly, spent quantities of the metal source material and the oxidant are exhausted from the reactor chamber through an exhaust port 38 to which is connected a vacuum pump, which is not shown. Finally, there is also shown within the schematic diagram of FIG. 2 a radiation source 28 whose radiation output 29 is introduced into the reactor chamber 21 through an appropriate transparent window 26 such as to be incident upon the substrate 24.

Within the second preferred embodiment of the present invention with respect to the oxidant source 36, the radiation source 28 and the window 26, the oxidant source 36, the radiation source 28 and the window 26 are otherwise generally analogous or equivalent to the oxidant source 13, the radiation source 15 and the window 20 as employed within the apparatus of the first preferred embodiment of the present invention, as illustrated within the schematic diagram of FIG. 1.

In addition, within the second preferred embodiment of the present invention the metal source material typically and preferably comprises at least one metal and carbon containing material, such as but not limited to an organometallic material, from which may typically and preferably be formed a metal oxide layer or a metal-silicon oxide layer upon the substrate 24. Typical metal and carbon containing materials include, but are not limited to organometallic materials such as but not limited to metal-carbon bonded alkyls, alkenyls, alkynls, carbonyls and aromatic derivatives, as well as metal alkoxide materials and metal chelate materials.

Analogously with the first preferred embodiment of the present invention, the metal source material has incorporated therein a contaminant material which reacts with the oxidant to form a volatile contaminant material when forming a metal oxide layer through reaction of the metal source material and the oxidant. Similarly, and also in accord with the first preferred embodiment of the present invention, while the contaminant material is typically and preferably a carbon contaminant material derived from a metal and carbon containing metal source material, sulfur contaminant materials and hydrogen contaminant materials are also plausible within the second preferred embodiment of the present invention. Finally, within the second preferred embodiment of the present invention, the carbon contaminant material is typically and preferably an integral portion of the metal and carbon containing metal source material.

As is understood by a person skilled in the art, the apparatus whose schematic cross-sectional diagram is illustrated in FIG. 2 may be employed within the context of any of several deposition methods to form upon the substrate 24 a metal oxide layer with enhanced purity. Such deposition methods include, but are not limited to thermal chemical vapor deposition (CVD) methods, plasma enhanced chemical vapor deposition (PECVD) methods, digital chemical vapor deposition (CVD) methods, reactive sputtering methods and atomic (or molecular) layer deposition (ALD) methods.

Within the context of the second preferred embodiment of the present invention, such an enhanced purity of the metal oxide layer is realized by employing simultaneously with forming the metal oxide layer while employing any of the foregoing deposition methods an irradiation of the substrate 24 with the radiation output 29 from the radiation source 28 in the presence of at least one of the oxidant and the metal source material.

Within the second preferred embodiment of the present invention, the deposition parameters that are employed within any of the foregoing deposition methods are generally conventional in the art of microelectronic fabrication, while the radiation output 29 from the radiation source 28 is typically and preferably provided at a dose of from about 0.01 to about 100 joules per square centimeter (more typically and preferably from about 0.5 to about 1 joules per square centimeter) of the substrate surface 24, when forming a metal oxide layer of thickness from about 5 to about 1000 angstroms.

As is further understood by a person skilled in the art, the irradiation of the substrate 24 with the radiation output 29 when forming a metal oxide layer upon the substrate 24 may be either continuous or discontinuous, where when discontinuous such discontinuity may be coordinated with a correlating discontinuity within a discontinuous deposition method, such as but not limited to an atomic (or molecular) layer deposition (ALD) method or a digital chemical vapor deposition (CVD) method generally, where either of the foregoing two deposition methods may employ sequential metal source material deposition or reaction followed by oxidant oxidation, and further wherein the radiation output 29 of the radiation source 28 may be coordinated with either the metal source material deposition or reaction, or the oxidant oxidation.

Upon forming upon the substrate 24 as illustrated within the schematic cross-sectional diagram of FIG. 2 a metal oxide layer in accord with the second preferred embodiment of the present invention, the metal oxide layer is formed in a first instance with enhanced purity insofar as the metal oxide layer is formed while irradiating the substrate 24 and at least one of a metal source material and an oxidant in the presence thereof when forming the metal oxide layer.

EXAMPLES 1–3

In order to illustrate the value of the present invention in providing enhanced purity metal oxide layers, there was first obtained three one centimeter square semiconductor substrates and formed upon each of the three one centimeter square semiconductor substrates an aluminum oxide dielectric layer while employing a thermal chemical vapor deposition (CVD) method which in turn employed an aluminum tris-hexafluoroacetylacetonate aluminum source material in conjunction with an oxygen oxidant source material. The three aluminum oxide dielectric layers were formed absent extrinsic irradiation during their formation and were thus formed as aluminum oxide dielectric layers formed of an aluminum oxide base material having uniformly incorporated therein a carbon contaminant material.

The thermal chemical vapor deposition (CVD) method also employed: (1) a reactor chamber pressure about 5 torr; (2) no radio frequency source or bias power; (3) a semiconductor substrate temperature of about 500 degrees centigrade; (4) an aluminum tris-hexafluoroacetylacetonate aluminum source material concentration in an argon carrier gas flow rate of about 30 standard cubic centimeters per minute (sccm) sufficient to provide a deposition rate of about 4 angstroms per minute; and (5) an oxygen oxidant flow rate of about 500 standard cubic centimeters per minute (sccm).

Of the three aluminum oxide dielectric layers, one each was formed to a thickness of about 80 angstroms, about 200 angstroms and about 3000 angstroms.

After forming the three aluminum oxide dielectric layers, a nuclear reaction analysis (NRA) analysis was undertaken for each of the aluminum oxide dielectric layers to confirm the aluminum oxide base material chemical composition of the three aluminum oxide dielectric layers and to ascertain an extent of carbon contaminant material concentration within each of the three aluminum oxide dielectric layers.

Each of the three aluminum oxide dielectric layers was then treated with an ultraviolet 248 nanometer excimer laser radiation exposure within an ambient air atmosphere at atmospheric pressure and at a temperature of about 22 degrees centigrade within an apparatus generally in accord with the apparatus as illustrated within FIG. 1. The ultraviolet 248 nanometer excimer laser radiation exposure was undertaken to provide each of the three aluminum oxide layers with a total dosage of about 5000 joules evenly distributed over the semiconductor substrate surface area of 1 square centimeter while employing an energy density of about 1,75 millijoule per square centimeter per pulse of a 15 square centimeter beam shape. The irradiation was undertaken employing 100 hertz pulsed irradiation.

After irradiating each of the three aluminum oxide layers with the ultraviolet 248 nanometer laser radiation exposure, a nuclear reaction analysis (NRA) analysis was again undertaken to confirm the chemical composition of the aluminum oxide base material and to determine a change in the concentration of the carbon contaminant material.

Figure 3:
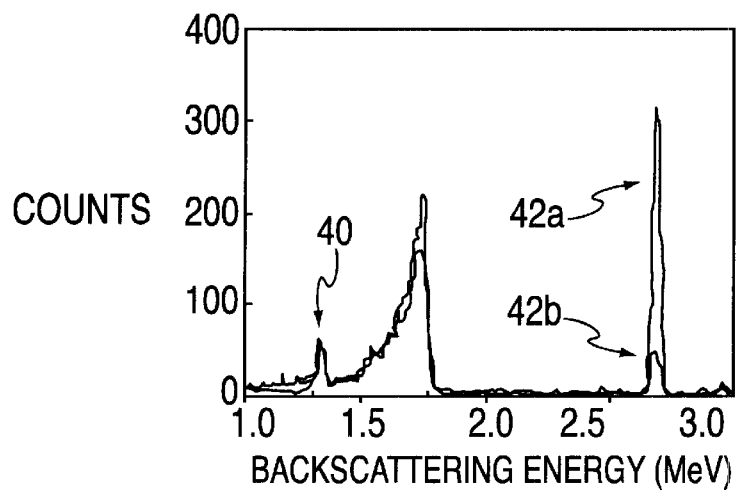
FIG. 3, FIG. 4 and FIG. 5 show a series of graphs of Counts versus Backscattering Energy for a nuclear reaction analysis (NRA) analysis of a series of aluminum oxide layers formed in accord with a series of examples of the present invention.
Figure 4:
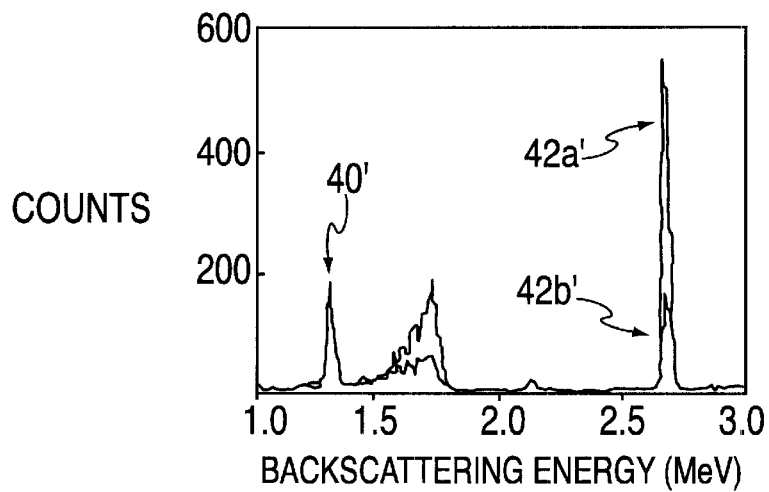
Figure 5:
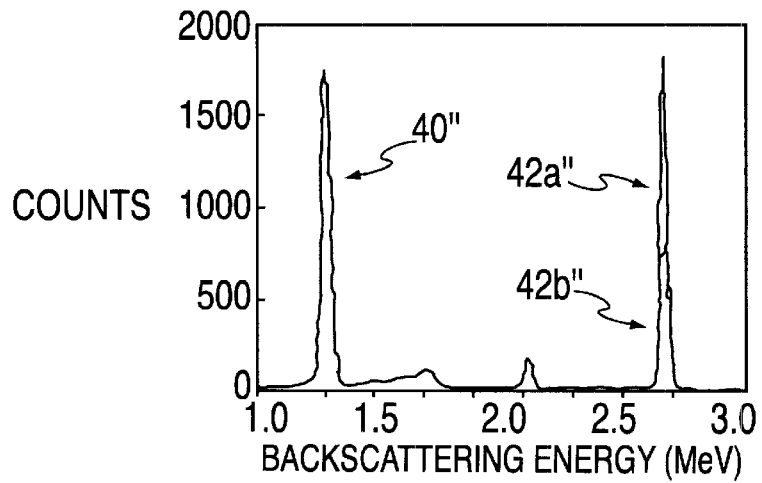

Results of the nuclear reaction analysis (NRA) analyses are shown in the graphs of FIG. 3, FIG. 4 and FIG. 5, which are directed, respectively, to the aluminum oxide dielectric layers formed at the thickness of about 80 angstroms, about 200 angstroms and about 3000 angstroms.

Within each of FIG. 3, FIG. 4 and FIG. 5, the peaks at about 1.3 MeV backscattering energy, which correspond with reference numerals 40, 40' and 40", correspond with nuclear reaction analysis (NRA) analysis peaks for oxygen. Within each of the three aluminum oxide dielectric layers, a magnitude of the peaks which correspond with reference numerals 40, 40' and 40" did not change incident to the ultraviolet 248 nanometer laser radiation exposure.

In contrast, within each of FIG. 3, FIG. 4 and FIG. 5 the peaks at 2.7 MeV backscattering energy, that correspond with nuclear reaction analysis (NRA) analysis peaks for carbon, do illustrate significant variation upon ultraviolet 248 nanometer laser radiation exposure. In that regard, the peaks that correspond with reference numerals 42a, 42a' and 42a' correspond with the carbon contaminant concentration within the three aluminum oxide dielectric layers prior to ultraviolet 248 nanometer laser radiation exposure, while the peaks which correspond with reference numeral 42b, 42b' and 42b' correspond with the carbon contaminant concentration within the three aluminum oxide dielectric layers after the ultraviolet 248 nanometer laser radiation exposure. Within the order of FIG. 3, FIG. 4 and FIG. 5, carbon contaminant concentration reductions range, respectively, from about 85 percent, to about 70 percent, to about 55 percent.

As is clearly seen from review of the data contained within the graphs of FIG. 3 to FIG. 5, incident to ultraviolet 248 nanometer laser radiation exposure of the three aluminum oxide dielectric layers there is observed a significant decrease in carbon contaminant concentration without compromising aluminum oxide base material stoichiometry.

Within the context of the present invention, such carbon contaminant concentration reduction will typically provide a metal oxide dielectric layer with enhanced dielectric properties, such as enhanced dielectric strength properties and reduced electrical leakage properties.

As is understood by a person skilled in the art, the preferred embodiments and examples of the present invention are illustrative of the present invention rather than limiting of the present invention. Revisions and modifications may be made to methods, materials, structures and dimensions through which is provided a method for purifying a metal oxide layer or a method for forming a metal oxide layer in accord with the preferred embodiments and examples of the present invention while still providing a method for purifying a metal oxide layer or a method for forming a metal oxide layer in accord with the present invention, further in accord with the accompanying claims.

What is claimed is:

1. A method for purifying a metal oxide layer comprising:
providing a substrate having formed thereover a metal oxide layer, the metal oxide layer being formed of a metal oxide base material having incorporated and uniformly distributed therein a concentration of a contaminant material susceptible to reaction with an oxidant to form a volatile contaminant material;
positioning the substrate within a reactor chamber;
introducing into the reactor chamber the oxidant;
irradiating within the reactor chamber the metal oxide layer and the oxidant with a radiation source such as to reduce within the metal oxide base material the concentration of the contaminant material and thus form from the metal oxide layer a purified metal oxide layer.

2. The method of claim 1 wherein the substrate is employed within a fabrication selected from the group consisting of microelectronic fabrications, optical fabrications and decorative fabrications.

3. The method of claim 1 wherein the metal oxide base material is selected from the group consisting of silicon oxides, aluminum oxides, zirconium oxides, hafnium oxides, tantalum oxides, yttrium oxides, titanium oxides, lanthanum oxides, gadolinium oxides, lanthanum-aluminum oxides, zirconium-aluminum oxides, yttrium-aluminum oxides, hafnium-aluminum oxides, titanium-aluminum oxides, barium-strontium-titanium oxides, lead-zirconium-titanium oxides, zirconium-silicon oxides, hafnium-silicon oxides, zirconium oxynitrides, yttrium oxynitrides, hafnium oxynitrides, tantalum oxynitrides, titanium oxynitrides, aluminum oxynitrides, zirconium-silicon oxynitrides, yttrium-silicon oxynitrides, hafnium-silicon oxynitrides, tantalum-silicon oxynitrides, titanium-silicon oxynitrides and aluminum-silicon oxynitrides.

4. The method of claim 1 wherein the contaminant is selected from the group consisting of carbon contaminants, sulfur contaminants and hydrogen contaminants.

5. The method of claim 1 wherein the oxidant is selected from the group consisting of oxygen containing oxidants and halogen containing oxidants.

6. The method of claim 1 wherein the radiation source is an ultraviolet radiation source selected from the group consisting of ultraviolet laser radiation sources, ultraviolet lamp radiation sources and ultraviolet plasma radiation sources.

7. A method for forming a metal oxide layer comprising:
providing a reactor chamber;
positioning within the reactor chamber a substrate;
forming over the substrate within the reactor chamber, while irradiating the substrate within the reactor chamber in the presence of at least one of an oxidant and a metal source material within the reactor chamber, a metal oxide layer, where the metal source material has incorporated therein a contaminant material susceptible to reaction with the oxidant to form a volatile contaminant material.

8. The method of claim 7 wherein by irradiating the substrate with the radiation source while forming over the substrate the metal oxide layer, a contaminant concentration within the metal oxide layer is decreased.

9. The method of claim 7 wherein the substrate is employed within a fabrication selected from the group consisting of microelectronic fabrications, optical fabrications and decorative fabrications.

10. The method of claim 7 wherein the oxidant is selected from the group consisting of oxygen containing oxidants and halogen containing oxidants.

11. The method of claim 7 wherein the metal source material is a metal and carbon containing source material selected from the group consisting of organometallic source materials, metal alkoxide source materials and metal chelate source materials.

12. The method of claim 7 wherein the contaminant is selected from the group consisting of carbon contaminants, sulfur contaminants and hydrogen contaminants.

13. The method of claim 7 wherein the radiation source is selected from the group consisting of ultraviolet laser radiation sources, ultraviolet lamp radiation sources and ultraviolet plasma radiation sources.

14. The method of claim 7 wherein the metal oxide layer is formed employing a method selected from the group consisting of thermal chemical vapor deposition (CVD) methods, plasma enhanced chemical vapor deposition (PECVD) methods, digital chemical vapor deposition (CVD) methods, reactive sputtering methods, atomic layer deposition (ALD) methods and molecular layer deposition (MLD) methods.

15. The method of claim 7 wherein the metal oxide layer is formed employing a discontinuous deposition method and the irradiation of the substrate is coordinated with a discontinuity within the discontinuous deposition method.

16. The method of claim 7 wherein the metal oxide layer is formed from a metal oxide selected from the group consisting of silicon oxides, aluminum oxides, zirconium oxides, hafnium oxides, tantalum oxides, yttrium oxides, titanium oxides, lanthanum oxides, gadolinium oxides, lanthanum-aluminum oxides, zirconium-aluminum oxides, yttrium-aluminum oxides, hafnium-aluminum oxides, titanium-aluminum oxides, barium-strontium-titanium oxides, lead-zirconium-titanium oxides, zirconium-silicon oxides, hafnium-silicon oxides, zirconium oxynitrides, yttrium oxynitrides, hafnium oxynitrides, tantalum oxynitrides, titanium oxynitrides, aluminum oxynitrides, zirconium-silicon oxynitrides, yttrium-silicon oxynitrides, hafnium-silicon oxynitrides, tantalum-silicon oxynitrides, titanium-silicon oxynitrides and aluminum-silicon oxynitrides.

* * * * *